United States Patent
Kurooka et al.

(10) Patent No.: US 10,249,563 B2
(45) Date of Patent: Apr. 2, 2019

(54) MULTILAYER WIRING SUBSTRATE

(71) Applicant: FUJIFILM Corporation, Tokyo (JP)

(72) Inventors: Shunji Kurooka, Haibara-gun (JP); Yoshinori Hotta, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 15/607,757

(22) Filed: May 30, 2017

(65) Prior Publication Data

US 2017/0330828 A1    Nov. 16, 2017

Related U.S. Application Data

(63) Continuation of application No. PCT/JP2015/085399, filed on Dec. 17, 2015.

(30) Foreign Application Priority Data

Dec. 19, 2014  (JP) ................. 2014-257473

(51) Int. Cl.
*H05K 1/11*  (2006.01)
*H05K 1/14*  (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC .... H05K 1/021; H05K 1/0212; H05K 1/0215; H05K 1/023; H05K 1/0231;
(Continued)

(56) References Cited

U.S. PATENT DOCUMENTS 5,805,426 A *  9/1998  Merritt ............. H01L 23/49827
                                                     257/707
7,026,239 B2 *  4/2006  Souriau ............... H01L 21/2885
                                                   257/E21.175
(Continued)

FOREIGN PATENT DOCUMENTS

CN    102089833 A    6/2011
CN    103140762 A    6/2013
(Continued)

OTHER PUBLICATIONS

Communication dated Mar. 13, 2018 from the Japanese Patent Office in counterpart Application No. 2016-564907.
(Continued)

*Primary Examiner* — Ishwarbhai B Patel
(74) *Attorney, Agent, or Firm* — Sughrue Mion, PLLC

(57) ABSTRACT

Provided is a multilayer wiring substrate capable of achieving excellent conduction reliability. The multilayer wiring substrate is formed by laminating an anisotropic conductive member including an insulating base which is made of an inorganic material, a plurality of conductive paths which are made of a conductive member, penetrate the insulating base in a thickness direction thereof and are provided in a mutually insulated state, and a pressure sensitive adhesive layer which is provided on a surface of the insulating base, in which each conductive path has a protrusion protruding from the surface of the insulating base, and a wiring substrate having a substrate and one or more electrodes to be formed on the substrate, and conductive paths which come into contact with the electrode among the plurality of conductive paths are deformed so that adjacent conductive paths come into contact with each other.

15 Claims, 4 Drawing Sheets

(51) Int. Cl.
  *H05K 3/36* (2006.01)
  *H05K 1/18* (2006.01)
(52) U.S. Cl.
  CPC .. *H01L 23/49811* (2013.01); *H01L 23/49822* (2013.01); *H01L 23/49827* (2013.01); *H01L 23/49866* (2013.01); *H01L 23/49894* (2013.01); *H01R 11/01* (2013.01); *H01R 12/52* (2013.01); *H05K 1/11* (2013.01); *H05K 1/14* (2013.01); *H01R 9/096* (2013.01); *H05K 1/18* (2013.01); *H05K 3/36* (2013.01)
(58) Field of Classification Search
  CPC .. H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162
  See application file for complete search history.

(56) References Cited

U.S. PATENT DOCUMENTS

2011/0117357 A1* 5/2011 Hatanaka ............... H01L 24/29
                                                                  428/312.8
2013/0252443 A1* 9/2013 Hotta ..................... G01R 1/0735
                                                                  439/66

FOREIGN PATENT DOCUMENTS

| | | |
|---|---|---|
| JP | 2005116291 A | 4/2005 |
| JP | 2010-067589 A | 3/2010 |
| JP | 2012-109306 A | 6/2012 |
| WO | 2012/043449 A1 | 4/2012 |

OTHER PUBLICATIONS

International Preliminary Report on Patentability with a Translation of Written Opinion issued from the International Bureau in counterpart International Application No. PCT/JP2015/085399, dated Jun. 29, 2017.
International Search Report of PCT/JP2015/085399 dated Mar. 15, 2016 [PCT/ISA/210].
Written Opinion of PCT/JP2015/085399 dated Mar. 15, 2016 [PCT/ISA/237].
Communication dated Sep. 5, 2018, issued by the Korean Intellectual Property Office in corresponding Korean Application No. 10-2017-7014603.
Communication dated Oct. 8, 2018, from State Intellectual Property Office of the P.R.C. in counterpart application No. 201580067306.1.

* cited by examiner

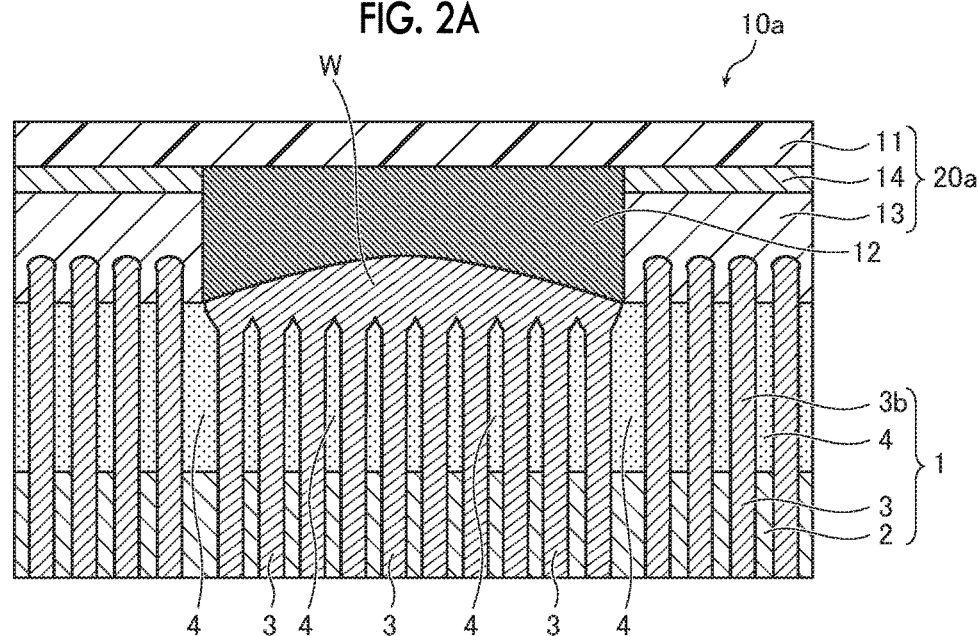
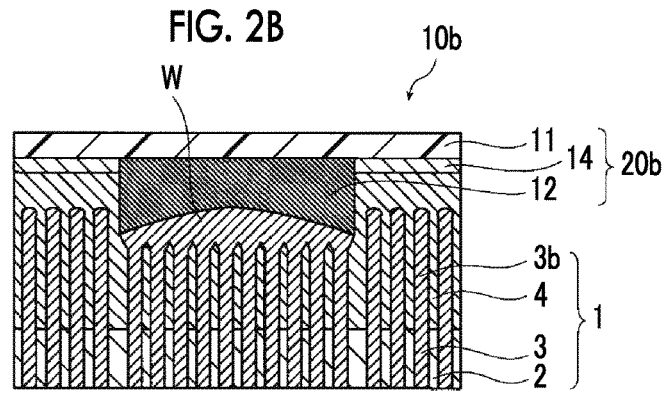
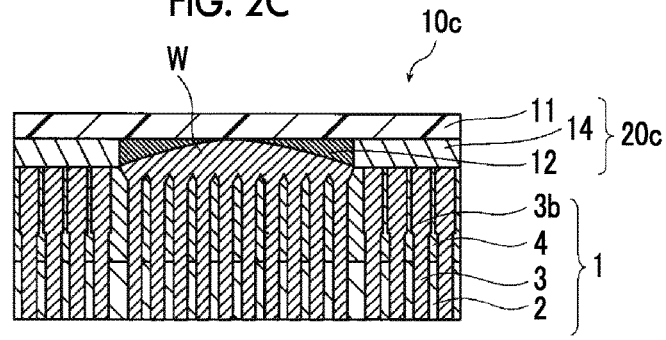

MULTILAYER WIRING SUBSTRATE

CROSS-REFERENCE TO RELATED APPLICATIONS

This application is a Continuation of PCT International Application No. PCT/JP2015/085399 filed on Dec. 17, 2015, which claims priority under 35 U.S.C. § 119(a) to Japanese Patent Application No. 2014-257473 filed on Dec. 19, 2014. The above application is hereby expressly incorporated by reference, in its entirety, into the present application.

BACKGROUND OF THE INVENTION

1. Field of the Invention

The present invention relates to a multilayer wiring substrate.

2. Description of the Related Art

A metal-filled microstructure (device) that is obtained by filling micropores provided in an insulating base with a metal is one of the fields which have attracted attention in recent nanotechnologies. For example, it is expected that a metal-filled microstructure will be used for an anisotropic conductive member.

This anisotropic conductive member is inserted between an electronic component such as a semiconductor element and a circuit board, and electrical connection is obtained between the electronic component and the circuit board by simply applying pressure to the anisotropic conductive member. Thus, an anisotropic conductive member is widely used, for example, as an electrical connection member for an electronic component such as a semiconductor element or as a connector for inspection in a functional test.

Particularly, downsizing of electronic components such as a semiconductor element remarkably occurs, and since conventional methods such as wire bonding in which wiring substrates are directly connected cannot secure sufficient connection stability, an anisotropic conductive member is attracting attention as an electronic connection member.

As a microstructure which can be used for such an anisotropic conductive member, for example, JP2010-067589A discloses a "microstructure including an insulating base having micropore through holes having an opening diameter of 10 to 500 nm at a density of $1\times10^6$ to $1\times10^{10}/$ mm$^2$, in which the micropore through holes are filled with a metal at a filling rate of 30% or more, and a layer made of a polymer is provided on at least one surface of the insulating base" ([Claim 1]).

SUMMARY OF THE INVENTION

As a result of conducting an investigation on a case of multilayering a wiring substrate using a microstructure described in JP2010-067589A, the present inventors have found that if the compression bonding force when the microstructure and the wiring substrate are subjected to compression bonding is weak, bonding of the conductive path of the microstructure and the electrode of the wiring substrate is weak to cause deterioration in conduction reliability in some cases; on the other hand, when the compression bonding force is strong, the conductive path is collapsed to make the conductive paths be electrically connected and thus there is a concern of a decrease in insulating properties.

An object of the present invention is to provide a multilayer wiring substrate capable of achieving excellent conduction reliability.

As a result of intensive investigations to achieve the above object, the present inventors have found that conductive paths which come into contact with an electrode among a plurality of conductive paths are deformed and adjacent conductive paths come into contact with each other so that excellent conduction reliability can be achieved. Thus, the present invention has been accomplished.

That is, the present inventors have found that the above problems can be solved by adopting the following configurations.

[1] A multilayer wiring substrate comprising: an anisotropic conductive member including an insulating base which is made of an inorganic material, a plurality of conductive paths which are made of a conductive member, penetrate the insulating base in a thickness direction thereof and are provided in a mutually insulated state, and a pressure sensitive adhesive layer which is provided on a surface of the insulating base, in which each conductive path has a protrusion protruding from the surface of the insulating base; and a wiring substrate having a substrate and one or more electrodes to be formed on the substrate, in which the multilayer wiring substrate is formed by laminating the anisotropic conductive member and the wiring substrate, and conductive paths which come into contact with the electrode among the plurality of conductive paths are deformed so that adjacent conductive paths come into contact with each other.

[2] The multilayer wiring substrate according to [1], in which the wiring substrate has a passivation layer which covers at least a part of the substrate, the electrode is formed to be flush with the passivation layer, and the protrusions of the conductive paths which come in contact with the passivation layer among the plurality of conductive paths do not come into contact with each other.

[3] The multilayer wiring substrate according to [1], in which the protrusions of the conductive paths other than the conductive paths which come in contact with the electrode among the plurality of conductive paths are embedded in the pressure sensitive adhesive layer.

[4] The multilayer wiring substrate according to [1], in which the wiring substrate has a resin layer which covers at least a part of the substrate, the electrode is formed to be flush with the resin layer, and at least a part of the protrusions of the conductive paths other than the conductive paths which come in contact with the electrode among the plurality of conductive paths is inserted into the resin layer.

[5] The multilayer wiring substrate according to any one of [1] to [4], in which materials for the electrode and the conductive path are the same.

[6] The multilayer wiring substrate according to any one of [1] to [5], in which the material for the conductive path is copper.

[7] The multilayer wiring substrate according to any one of [1] to [6], in which the pressure sensitive adhesive layer does not contain a filler.

As described below, according to the present invention, it is possible to provide a multilayer wiring substrate capable of achieving excellent conduction reliability.

BRIEF DESCRIPTION OF THE DRAWINGS

FIGS. 2A to 2C are enlarged schematic cross-sectional views respectively showing a part of an anisotropic conductive member of an embodiment of the present invention.

DESCRIPTION OF THE PREFERRED EMBODIMENTS

Hereinafter, the present invention will be described in detail.

The description of the constitution requirements to be described below is made on the basis of representative embodiments of the present invention, but the present invention is not limited to these embodiments.

The numerical range represented by the term "to" in the specification includes the numerical values set forth before and after "to" as lower and upper limits, respectively.

[Multilayer Wiring Substrate]

A multilayer wiring substrate of the present invention is a multilayer wiring substrate formed by laminating an anisotropic conductive member including an insulating base which is made of an inorganic material, a plurality of conductive paths which are made of a conductive member, penetrate the insulating base in a thickness direction thereof, and are provided in a mutually insulated state, and a pressure sensitive adhesive layer which is provided on a surface of the insulating base, in which each conductive path has a protrusion protruding from the surface of the insulating base; and a wiring substrate having a substrate and one or more electrodes to be formed on the substrate, in which conductive paths which come into contact with the electrode among the plurality of conductive paths are deformed and adjacent conductive paths come into contact with each other.

In the multilayer wiring substrate of the present invention, excellent conduction reliability can be achieved by adopting a configuration in which conductive paths which come into contact with the electrode among the plurality of conductive paths are deformed and adjacent conductive paths come into contact with each other in the multilayer wiring substrate formed by laminating the anisotropic conductive member which has conductivity in the thickness direction and is insulated in a plane direction by providing the plurality of conductive paths which penetrate the insulating base in the thickness direction, and the wiring substrate, as described above.

That is, when the electrode is connected to (is bonded to) the anisotropic conductive member in the wiring substrate, the conductive path and the electrode are reliably bonded by making conductive paths coming into contact with the electrode come into contact with each other, and respectively maintaining conductive paths not coming into contact with the electrode in an electrically independent state, and the conductive paths can be prevented from being electrically connected to deteriorate insulating properties. Thus, excellent conduction reliability can be obtained.

Next, the configuration of the multilayer wiring substrate of the present invention will be described using FIG. 1.

Figure 1:
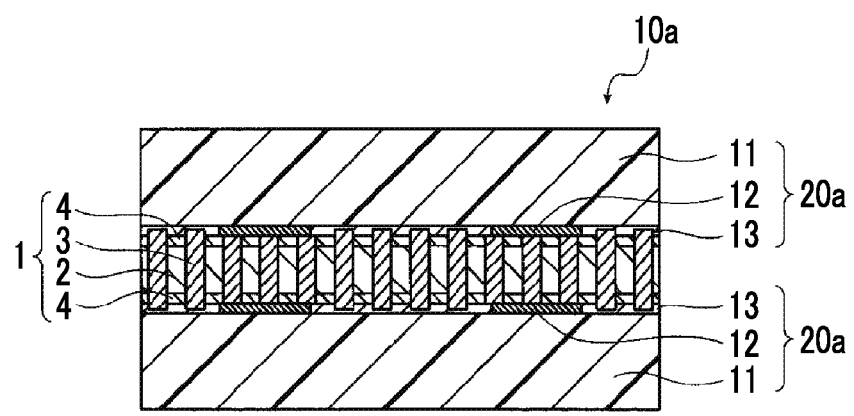
FIG. 1 is a schematic view showing an example of a multilayer wiring substrate of a suitable embodiment of the present invention.

A multilayer wiring substrate 10a shown in FIG. 1 includes an anisotropic conductive member 1 having an insulating base 2, a plurality of conductive paths 3 which are provided to penetrate the insulating base 2 in a thickness direction thereof, and a pressure sensitive adhesive layer 4 which is provided on a surface of the insulating base 2, and a wiring substrate 20a obtained by forming an electrode 12 on a substrate 11, in which the wiring substrate 20a is laminated on one surface of the anisotropic conductive member 1, and the wiring substrate 20a is laminated on the other surface of the anisotropic conductive member 1. In the multilayer wiring substrate 10a, the electrodes 12 of the two wiring substrates 20a are electrically connected by laminating two wiring substrates 20a to sandwich the anisotropic conductive member 1.

FIG. 2A is an enlarged cross-sectional view showing a connection portion of the electrode 12 of the wiring substrate 20a and the conductive paths 3 of the anisotropic conductive member 1 in the multilayer wiring substrate 10a shown in FIG. 1.

The multilayer wiring substrate 10a shown in FIG. 2A has a configuration in which protrusions 3b of conductive paths 3 other than conductive paths 3 which come into contact with the electrode among the plurality of conductive paths 3 are embedded in a resin layer 13.

That is, the multilayer wiring substrate 10a shown in FIG. 2A is a multilayer wiring substrate having a configuration in which the multilayer wiring substrate has a resin layer which covers at least a part of the substrate, the electrode is formed to be flush with the resin layer, and at least a part of protrusions of conductive paths other than conductive paths which come into contact with the electrode among the plurality of conductive paths are inserted into the resin layer in the present invention.

The wiring substrate 20a of the multilayer wiring substrate 10a shown in FIG. 2A includes the substrate 11, the electrode 12 which is formed on the substrate 11, a passivation layer 14 formed on the surface of the substrate 11 other than a region in which the electrode 12 is formed, and the resin layer 13 which is laminated on the passivation layer 14.

In the example shown in the drawing, the electrode 12 is formed to be substantially flush with the resin layer 13. In addition, the electrode 12 is formed to have a recessed shape such that the thickness of the center portion is made thin due to the occurrence of dishing at the time of polishing.

On the other hand, the anisotropic conductive member 1 includes the insulating base 2, the plurality of conductive paths 3 which are made of a conductive member and penetrate the insulating base 2 in the thickness direction, and the pressure sensitive adhesive layer 4 which is provided on the surface of the insulating base 2.

In addition, the conductive path 3 has the protrusion 3b which protrudes from the surface of the insulating base 2 and the end of the protrusion 3b is provided to be exposed or protrude from the surface of the pressure sensitive adhesive layer 4.

In the present invention, as shown in FIG. 2A, the distal ends of the protrusions 3b of the conductive paths 3 which come in contact with the electrode 12 among the plurality of conductive paths 3 are collapsed and adjacent conductive paths 3 come into contact with each other so that the distal ends are integrally formed as indicated by the reference W.

In this manner, the protrusions 3b of the conductive paths 3 come into contact with each other and are integrally formed to come into contact with the electrode 12. Thus, the conductive paths are reliably connected to the electrode 12.

On the other hand, the distal ends of the protrusions 3b of the conductive paths 3 which do not come into contact with the electrode 12 are inserted into the resin layer 13 of the wiring substrate 20a and maintain a mutually insulated state without coming into contact with each other.

In this manner, in the case in which the wiring substrate 20a has the resin layer 13 on the surface thereof, by making the distal ends of the protrusions 3b of the conductive paths 3 which do not come into contact with the electrode 12 are inserted into the resin layer 13, when the wiring substrate 20a and the anisotropic conductive member 1 are bonded, the conductive paths 3 are prevented from being collapsed and the conductive paths 3 are prevented from coming into contact with each other to deteriorate insulating properties.

Accordingly, the connection of the electrode 12 and the conductive paths 3 is reliably made and the insulating properties of the conductive paths 3 which are not connected with the electrode 12 can be prevented from deteriorating. Thus, excellent conduction reliability can be achieved.

Here, in the example shown in FIG. 2A, the wiring substrate 20a is configured to have the resin layer 13 into which the protrusions 3b of the conductive paths 3 can be inserted, but the configuration is not limited thereto.

FIG. 2B shows an enlarged cross-sectional view of a connection portion of another example of the multilayer wiring substrate of the present invention.

A multilayer wiring substrate 10b shown in FIG. 2B is a multilayer wiring substrate having a configuration in which the protrusions of the conductive paths other than the conductive paths which come into contact with the electrode among the plurality of conductive paths are embedded in the pressure sensitive adhesive layer in the present invention.

A wiring substrate 20b of the multilayer wiring substrate 10b shown in FIG. 2B has the same configuration as the wiring substrate 20a shown in FIG. 2A except that the resin layer 13 is not provided.

That is, the wiring substrate 20b shown in FIG. 2B has the substrate 11, the electrode which is formed on the substrate 11, and the passivation layer 14 which is formed on the surface of the substrate 11 other than a region in which the electrode 12 is formed. As shown in the drawing, the electrode 12 is formed to be thicker than the passivation layer 14, and the electrode 12 is provided to protrude from the passivation layer 14.

In the multilayer wiring substrate 10b having such a wiring substrate 20b, as shown in FIG. 2B, the anisotropic conductive member 1 and the wiring substrate 20b are laminated such that the pressure sensitive adhesive layer 4 of the anisotropic conductive member 1 comes into contact with the passivation layer of the wiring substrate 20b.

Here, the distal ends of the protrusions 3b of the conductive paths 3 which come into contact with the electrode 12 are collapsed as in the multilayer wiring substrate 10a shown in FIG. 2A and adjacent conductive paths 3 comes into contact with each other so that the distal ends are integrally formed as indicated with the reference numeral W.

On the other hand, the protrusions 3b of the conductive paths 3 which do not come into contact with the electrode 12 do not come into contact with the passivation layer 14 and are embedded into the pressure sensitive adhesive layer 4 since the thickness of the facing passivation layer 14 is thinner than the thickness of the electrode 12. Accordingly, each conductive path 3 maintains a mutually insulated state without coming into contact each other.

In this manner, in the case in which the wiring substrate 20b does not include the resin layer 13 on the surface thereof, by embedding the protrusions 3b of the conductive paths 3 which do not come into contact with the electrode 12 in the pressure sensitive adhesive layer 4, when the wiring substrate 20b and the anisotropic conductive member 1 are bonded, the conductive paths 3 are prevented from being collapsed and the conductive paths 3 are prevented from coming into contact with each other to deteriorate insulating properties.

Accordingly, the connection of the electrode 12 and the conductive paths 3 is reliably made and the insulating properties of the conductive paths 3 which are not connected to the electrode 12 can be prevented from deteriorating so that excellent conduction reliability can be achieved.

In addition, in the example shown in FIG. 2B, the wiring substrate 20b is configured such that the electrode 12 is formed to be thicker than the passivation layer 14, but the configuration is not limited thereto.

FIG. 2C is an enlarged cross-sectional view of a connection portion of another example of the multilayer wiring substrate of the present invention.

A multilayer wiring substrate 10c shown in FIG. 2C is a multilayer wiring substrate having a configuration in which a wiring substrate has the passivation layer which covers at least a part of the substrate, the electrode is formed to be flush with the passivation layer, and the protrusions of the conductive paths which come into contact with the passivation layer among the plurality of conductive paths does not come into contact with each other in the present invention.

A wiring substrate 20c of the multilayer wiring substrate 10c shown in FIG. 2C has the same configuration as the wiring substrate 20b shown in FIG. 2B except that the resin electrode 12 is formed to be flush with the passivation layer 14.

That is, the wiring substrate 20c shown in FIG. 2C has the substrate 11, the electrode which is formed on the substrate 11, and the passivation layer 14 which is formed on the surface of the substrate 11 other than a region in which the electrode 12 is formed. In addition, as shown in the drawing, the thickness of the electrode 12 is almost the same as the thickness of the passivation layer 14 and is formed to be flush with the passivation layer.

In the multilayer wiring substrate 10c having such a wiring substrate 20c, as shown in FIG. 2C, the distal ends of the protrusions 3b of the conductive paths 3 which come into contact with the electrode 12 among the conductive paths 3 of the anisotropic conductive member 1 laminated on the wiring substrate 20c are collapsed and adjacent conductive paths 3 come into contact with each other as in the multilayer wiring substrate 10b shown in FIG. 2B so that the distal ends are integrally formed as indicated by the reference W.

On the other hand, the distal ends of the protrusions 3b of the conductive paths 3 which do not come into contact with the electrode 12 come into contact with the passivation layer 14 and are compressed in the thickness direction. While the diameter of each conductive path 3 increases in the pressure sensitive adhesive layer 4, each conductive path 3 maintains a mutually insulated state without coming into contact with each other.

In this manner, even in the case in which the electrode 12 is formed to be flush with the passivation layer 14 on the surface of the wiring substrate 20c, the contact between the conductive paths 3 which do not come into contact with the electrode 12 is prevented and thus insulating properties are prevented from deteriorating.

Accordingly, the electrode 12 and the conductive paths 3 are reliably connected to each other and the insulting properties of the conductive paths 3 which are not connected to the electrode 12 are prevented from deteriorating so that excellent conduction reliability can be achieved.

In the example shown in FIG. 1, two wiring substrates 20a are laminated to sandwich one anisotropic conductive member 1, but the configuration is not limited thereto. Each two or more wiring substrates and the anisotropic conductive members may be alternately laminated.

Next, the material, size, and forming method of the constitutional elements of the multilayer wiring substrate of the present invention will be described.

[Anisotropic Conductive Member]

The anisotropic conductive member used for the multilayer wiring substrate of the present invention will be described using FIGS. 3A and 3B.

Figure 3A:
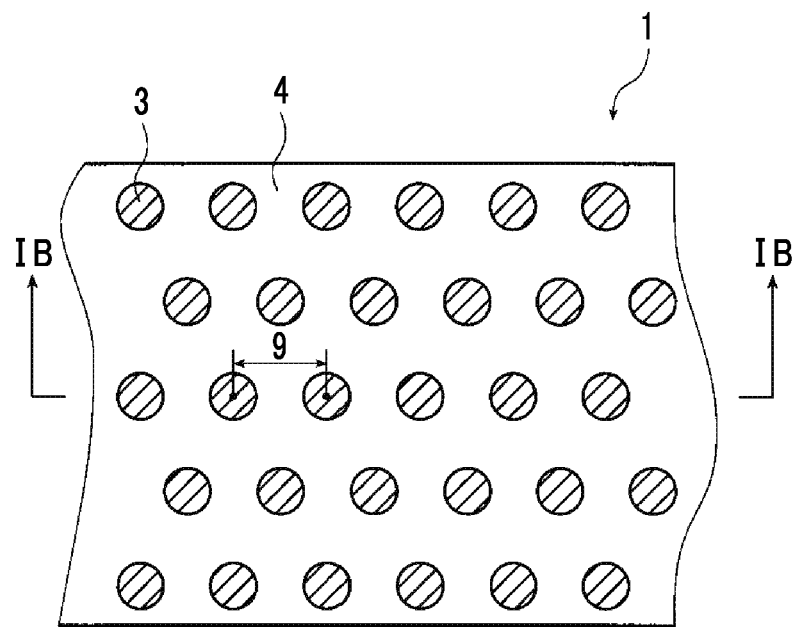
FIG. 3A is a schematic top view showing an example of an anisotropic conductive member suitably used for the multilayer wiring substrate of the present invention.
Figure 3B:
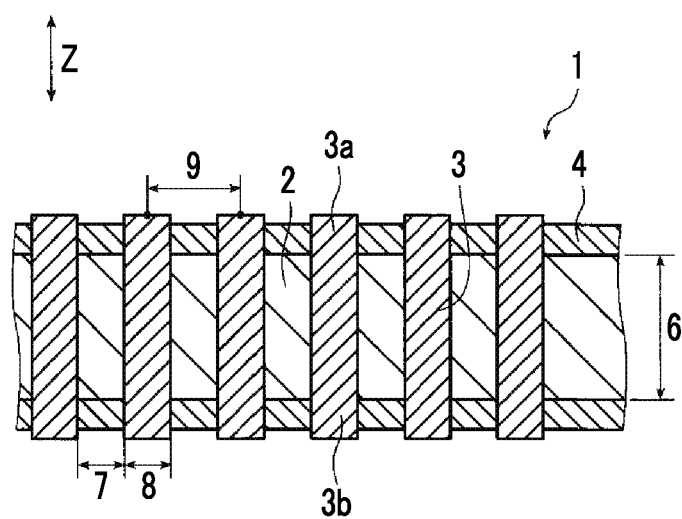
FIG. 3B is a cross-sectional view taken along line 1B-1B of FIG. 3A.

The anisotropic conductive member 1 shown in FIGS. 3A and 3B is an example of the anisotropic conductive member in a state before the anisotropic conductive member and the wiring substrate 20 are laminated, and includes the insulating base 2, the plurality of conductive paths 3 which are made of a conductive member, and the pressure sensitive adhesive layer 4 which is provided on the surface of the insulating base 2.

In addition, the conductive paths 3 are provided to penetrate the insulating base 2 in the thickness direction in a state in which the conductive paths are mutually insulated as shown in FIGS. 3A and 3B.

Further, as shown in FIG. 3B, the conductive paths 3 has protrusions 3a and 3b which protrude from the surface of the insulating base 2, and the ends of the protrusions 3a and 3b are provided to be exposed or protrude from the surface of the pressure sensitive adhesive layer 4.

Here, the term "mutually insulated state" means a state in which each conductive path present inside (in the thickness direction) the insulating base is mutually insulated inside the insulating base.

In addition, in FIG. 3B, the embodiment having the pressure sensitive adhesive layer 4 on surfaces 2a and 2b of the insulating base 2 is shown, but in the present invention, the pressure sensitive adhesive layer may be provided on at least one surface of the insulating base.

Similarly, in FIG. 3B, the embodiment in which the both ends of the conductive path 3 have the protrusions (references 3a and 3b) is shown, but in the present invention, the conductive path may have a protrusion protruding from the surface of the insulating base at least having the pressure sensitive adhesive layer.

[Insulating Base]

The insulating base constituting the anisotropic conductive member is made of an inorganic material and is not particularly limited as long as the insulating base may be an insulating base having substantially the same electrical resistivity (about $10^{14}\Omega \cdot cm$) as that of an insulating base constituting a conventionally known anisotropic conductive film or the like.

The "made of an inorganic material" is a definition to distinguish the material of the insulating base from a polymer material constituting the pressure sensitive adhesive layer, which will be described later, and is not limited to an insulating base made of only an inorganic material but refers to an insulating base having an inorganic material as a main component (50% by mass or more).

Examples of the insulating base include a glass base, a ceramic base (for example, silicon carbide, and silicon nitride), a carbon base (for example, diamond-like carbon), a polyimide base, and a composite material of these, and the insulating base may be a material of a film of an inorganic material including 50% by mass or more of a ceramic material and a carbon material that is formed on an organic material having through holes.

In the present invention, the insulating base is preferably an anodized film of a valve metal for the reason that micropores having a desired average opening diameter are formed as through holes and thus conductive paths, which will be described later, are easily formed.

Here, specific examples of the valve metal include aluminum, tantalum, niobium, titanium, hafnium, zirconium, zinc, tungsten, bismuth, and antimony.

Among these, an anodized film (base) of aluminum is preferably used because aluminum has a good dimensional stability and is relatively inexpensive.

In the present invention, the thickness of the insulating base (a portion indicated by the numeral reference 6 in FIG. 3B) is preferably 1 μm to 1,000 μm, more preferably 3 μm to 500 μm, and still more preferably 3 μm to 300 μm. When the thickness of the insulating base is within this range, the handleability of the insulating base becomes satisfactory.

In addition, in the present invention, the width (a portion indicated by the numeral reference 7 in FIG. 3B) between the conductive paths in the insulating base is preferably 10 nm or more and more preferably 20 nm to 200 nm. When the width between the conductive paths in the insulating base is within this range, the insulating base sufficiently functions as an insulating partition wall.

[Conductive Path]

The plurality of conductive paths constituting the anisotropic conductive member are conductive paths which are made of a conductive material, penetrate the insulating base in the thickness direction, and are provided in a mutually insulated state.

In addition, the conductive paths have protrusions protruding from the surface of the insulating base.

<Conductive Material>

The conductive material constituting the conductive paths is not particularly limited as long as the material has an electrical resistivity of $10^3 \Omega \cdot cm$ or less. Specific preferable examples of the material include gold (Au), silver (Ag), copper (Cu), aluminum (Al), magnesium (Mg), nickel (Ni), and tin oxide doped with indium (Iridium Tin Oxide: ITO).

Among these, from the viewpoint of electrical conductivity, a metal is preferable, copper, gold, aluminum and nickel are more preferable, copper and gold are still more preferable, and from the viewpoint of costs and versatility, copper is particularly preferable.

In addition, when the conductive paths are connected to the electrode of the wiring substrate, from the viewpoint that conduction reliability is further enhanced by more firmly bonding the conductive paths to the electrode, it is preferable to use the same material as the electrode of the wiring substrate.

<Protrusion>

The protrusions of the conductive paths are portions of the conductive paths that protrude from the surface of the insulating base.

Next, the shape of the protrusion of the conductive path will be described using FIG. 3B.

In the example shown in FIG. 3B, the ends of the protrusions 3a and 3b of the conductive paths 3 protrude from the surface of the pressure sensitive adhesive layer 4.

In addition, the protrusions 3a and 3b of each conductive path 3 are respectively formed not to come into contact with the protrusions 3a and 3b of other conductive paths 3.

In the example shown in the drawing, the ends of the protrusions 3a and 3b protrude from the surface of the pressure sensitive adhesive layer 4, but the configuration is not limited thereto. The end surfaces of the protrusions 3a and 3b may be formed to be substantially flush with the surface of the pressure sensitive adhesive layer 4, or the ends of the protrusions 3a and 3b may be embedded in the pressure sensitive adhesive layer 4. From the viewpoint of achieving a reliable connection with the electrode during lamination of the anisotropic conductive member on the wiring substrate, the end surfaces of the protrusions 3a and 3b are preferably exposed from the surface of the pressure sensitive adhesive layer 4, and the ends of the protrusions 3a and 3b are more preferably protrude from the surface of the pressure sensitive adhesive layer 4.

In addition, the protrusions of the conductive paths may be formed into a columnar shape linearly continuing from the conductive paths present inside the insulating base 2, or may be formed into a columnar shape bent from the conductive paths present inside the insulating base 2.

In the example shown in the drawing, the protrusions 3a and 3b of all of the conductive paths 3 do not come into contact with one another, but the configuration sit no limited thereto. As long as anisotropy in conductivity can be exhibited, a part of the protrusions 3a and 3b may come into contact with one another.

In the present invention, the height or aspect ratio of the protrusions (height of protrusion/diameter of protrusion) may be appropriately determined according to the wiring substrate to be connected, a bonding method, and the like.

When the anisotropic conductive member is connected (bonded) to the wiring substrate by means of compression or the like, from the reason that insulating properties in the plane direction in the case in which protrusions other than protrusions to be connected to the electrode are collapsed can be sufficiently secured, the aspect ratio of the protrusion of the conductive path (height of protrusion/diameter of protrusion) is preferably 0.01 or more and less than 20 and more preferably 6 to 20.

In addition, in the present invention, from the viewpoint of following the surface shape of a wiring substrate which is an object to be connected and sufficiently securing insulating properties in the plane direction in the case in which protrusions other than protrusions to be connected to the electrode are collapsed, the height of the protrusion of the conductive path is preferably 50 nm to 1,500 nm and more preferably 300 to 1,050 nm.

Similarly, the diameter of the protrusion of the conductive path is preferably more than 5 nm and 10 µm or less and more preferably 40 nm to 1,000 nm.

<Other Shapes>

The conductive path has a columnar shape and the diameter thereof (a portion that is indicated by the reference numeral 8 in FIG. 3B) is preferably more than 5 nm and 10 µm or less and more preferably 40 nm to 1,000 nm, similar to the diameter of the protrusion.

In addition, the conductive paths are presented in a state in which the conductive paths are insulated from each other by the insulating base. The density thereof is preferably 20,000 conductive paths/mm² or more, more preferably 2,000,000 conductive paths/mm² or more, still more preferably 10,000,000 conductive paths/mm² or more, particularly preferably 50,000,000 conductive paths/mm² or more, and most preferably 100,000,000 conductive paths/mm² or more.

Further, the center-to-center distance between adjacent each conductive path (a portion indicated by the reference numeral 9 in FIG. 3A) is preferably 20 nm to 500 nm, more preferably 40 nm to 200 nm, and still more preferably 50 nm to 140 nm.

[Pressure Sensitive Adhesive Layer]

The pressure sensitive adhesive layer constituting the anisotropic conductive member of the present invention is a layer that is provided on the surface of the insulating base and contributes to adhesion of portions of the wiring substrate other than the electrodes.

In the present invention, for the reason that warping caused by different shrinkage after connection can be reduced, the pressure sensitive adhesive layer is preferably a layer containing a polymer material having a thermal expansion coefficient of less than $50 \times 10^{-6}$ K$^{-1}$ and more preferably a layer containing a polymer material having $5 \times 10^{-6}$ K$^{-1}$ to $30 \times 10^{-6}$ K$^{-1}$.

The reason why warping after connection can be reduced as described can be thought as follows. A difference in thermal expansion factor between the pressure sensitive adhesive layer and a wiring substrate which is an object to be connected is reduced and a film thickness to absorb a displacement difference is not required so that the thickness of the pressure sensitive adhesive layer can be reduced. As a result, the influence of the thermal expansion factor of the pressure sensitive adhesive layer itself can be reduced.

Here, the thermal expansion coefficient refers to a value obtained by measurement according to the "Testing method for linear thermal expansion coefficient of plastics by thermomechanical analysis" of JIS K 7197:1991 and in the case of using two or more polymer materials in combination, a value obtained by measuring a mixture of these polymer materials is used.

<Polymer Material>

The polymer material is not particularly limited and one or two or more polymer materials may be appropriately selected from known resin materials to have a thermal expansion coefficient of less than $50 \times 10^{-6}$ K$^{-1}$.

Among these, for the reasons that the gap between the wiring substrate and the anisotropic conductive member can be effectively filled and the adhesiveness with the wiring substrate is further increased, a polyimide resin (thermal expansion coefficient: $30 \times 10^{-6}$ K$^{-1}$ to $50 \times 10^{-6}$ K$^{-1}$) and/or an epoxy resin (thermal expansion coefficient: $45 \times 10^{-6}$ K$^{-1}$ to $65 \times 10^{-6}$ K$^{-1}$) is preferably used.

Specific preferable examples of the epoxy resin include jER (registered trademark) 828 (manufactured by Mitsubishi Chemical Corporation) and jER (registered trademark) 1004 (manufactured by Mitsubishi Chemical Corporation).

In addition, in the pressure sensitive adhesive layer, from the viewpoint of preventing the electrode from coming into contact with an unintended portion due to a difference in amount of deformation caused by a difference in thermal expansion or the like, particles (filler) of an inorganic material such silica, alumina, silicon nitride, mica, or white carbon may be dispersed in the resin. However, when the pressure sensitive adhesive layer contains the filler, there is a concern of the conductive paths being collapsed by the filler when the anisotropic conductive member and the wiring substrate are laminate. Accordingly, it is preferable that the pressure sensitive adhesive layer does not contain the filler.

The particle diameter of the filler is preferably 80 nm to 500 nm from the viewpoint of reducing the collapse of the conductive paths or the like.

<Shape>

In the present invention, from the viewpoint of following the surface shape of a wiring substrate which is an object to be connected, the thickness of the pressure sensitive adhesive layer is preferably 50 nm to 1,500 nm and more preferably 250 nm to 1,000 nm.

As described above, the protrusions of the conductive paths may protrude or may be exposed from the surface of the pressure sensitive adhesive layer or may be covered by the pressure sensitive adhesive layer. However, from the viewpoint of achieving a more reliable connection with the electrode when the anisotropic conductive member and the wiring substrate are laminated, it is preferable that the ends of the protrusions are exposed or protrude from the surface of the pressure sensitive adhesive layer. Among these, for the reason that the connection resistance between the conductive paths and the electrode can be further reduced, the absolute value of a difference between the height of the protrusion of the conductive path and the thickness of the pressure sensitive adhesive layer is preferably 0 nm to 50 nm. A state in which the absolute value of a difference between the height of the protrusion of the conductive path and the thickness of the pressure sensitive adhesive layer is 0 nm is a state in which the end of the protrusion of the conductive path is exposed from the surface of the pressure sensitive adhesive layer.

The reason why the connection resistance can be reduced as described above can be thought that by controlling the absolute value of the thickness difference to be within the above-described range, even in a state in which the pressure sensitive adhesive layer is deformed, the connection between the electrode and the conductive path is hardly disturbed.

[Method of Producing Anisotropic Conductive Member]

Next, the method of producing the anisotropic conductive member will be described.

The method of producing the anisotropic conductive member is not particularly limited. For example, the production method includes a conductive path forming step of forming the conductive paths by filling the through holes provided in the insulating base with the conductive material, a trimming step of removing only a part of the surface of the insulating base after the conductive path forming step and causing the conductive paths to protrude, and a pressure sensitive adhesive layer forming step of forming a pressure sensitive adhesive layer only on the surface of the insulating base after the trimming step.

[Preparation of Insulating Base]

For the insulating base, for example, a glass substrate having through holes (Through Glass Via: TGV) can be used as it is. However, from the viewpoint of controlling the opening diameter of the conductive path and the aspect ratio of the protrusion to be within the above-described ranges, a method of subjecting a valve metal to an anodizing treatment is preferable.

As the anodizing treatment, for example, in the case in which the insulating base is an anodized film of aluminum, an anodizing treatment of anodizing an aluminum substrate is carried out and then a perforating treatment of perforating the substrate to form holes of micropores formed by the anodization after the anodizing treatment is carried out sequentially to prepare an insulating base.

In the present invention, regarding the aluminum substrate used for the preparation of the insulating base and each of the treatment steps to be carried out on the aluminum substrate, the same aluminum substrates and treatment steps as in the description of paragraphs [0041] to [0121] of JP2008-270158A can be adopted.

[Conductive Path Forming Step]

The conductive path forming step is a step of filling the through holes that are provided in the insulating base with the conductive material.

Figure 4:
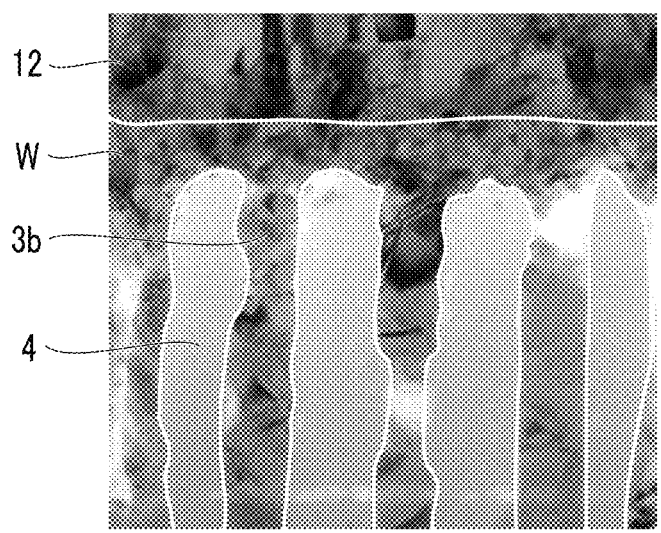
FIG. 4 is a cross-sectional photograph of a contact portion of an electrode and a conductive path in Example 1.

Here, as the method of filling the through holes with a metal, for example, the same methods as each method described in paragraphs [0123] to [0126] and [FIG. 4] of JP2008-270158A.

Through the metal filling step, an anisotropic conductive member before the protrusions of the conductive paths are formed is obtained.

On the other hand, instead of using the methods described in JP2008-270158A, for example, the conductive path forming step may be a method having an anodizing treatment step of forming an anodized film having micropores present in the thickness direction and a barrier layer present at the bottom of the micropores on one surface of an aluminum substrate by subjecting one surface of the aluminum substrate (hereinafter, also referred to as "one surface") to an anodizing treatment, a barrier layer removal step of removing the barrier layer of the anodized film after the anodizing treatment step, a metal filling step of filling the micropores with a metal by subjecting the anodized film to an electrolytic plating treatment after the barrier layer removal step, and a substrate removal step of obtaining a metal-filled microstructure by removing the aluminum substrate after the metal filling step.

<Anodizing Treatment Step>

The anodizing step is a step of forming an anodized film having micropores present in the thickness direction and a barrier layer present at the bottom of the micropores on one surface of the aluminum substrate by subjecting one surface of the aluminum substrate to an anodizing treatment.

In the production method of the present invention, the anodizing treatment can be carried out using known methods but from the viewpoint of increasing regularity of micropore arrangement and securing anisotropic conductivity, a self-regulation method and a constant voltage treatment are preferably used.

Here, regarding the self-regulation method and the constant voltage treatment of the anodizing treatment, the same treatments as each of the treatments described in paragraphs [0056] to [0108] and [FIG. 3] of JP2008-270158A can be carried out.

<Barrier Layer Removal Step>

The barrier layer removal step is a step of removing the barrier layer of the anodized film after the anodizing treatment step. By removing the barrier layer, a part of the aluminum substrate is exposed through the micropores.

The method of removing the barrier layer is not particularly limited and examples thereof include a method of electrochemically dissolving the barrier layer at a potential lower than the potential in the anodizing treatment of the anodizing treatment step (hereinafter, also referred to as an "electrolytic removal treatment"); a method of removing the barrier layer by etching (hereinafter, also referred to as an "etching removal treatment"); and a method of combining these methods (particularly, a method of removing the barrier layer remaining after the electrolytic removal treatment is carried out by the etching removal treatment).

<Electrolytic Removal Treatment>

The electrolytic removal treatment is not particularly limited as long as the electrolytic treatment is carried out at a potential lower than the potential in the anodizing treatment of the anodizing treatment step (electrolytic potential).

In the present invention, the electrolytic removal treatment may be carried out continuously with the anodizing treatment by, for example, dropping the electrolytic potential when the anodizing treatment step is completed.

For the conditions for the electrolytic removal treatment other than electrolytic potential, the same electrolytic solutions and treatment conditions as in the above-described known anodizing treatments can be adopted.

Particularly, in the case in which the electrolytic removal treatment and the anodizing treatment are continuously carried out as described above, it is preferable to carry out the treatments using the same electrolytic solution.

(Electrolytic Potential)

The electrolytic potential in the electrolytic removal treatment is preferably dropped to a potential lower than the electrolytic potential in the anodizing treatment continuously or stepwise.

The reduction range (step width) when the electrolytic potential is dropped stepwise is preferably 10 V or less, more preferably 5 V or less, and still more preferably 2 V or less from the viewpoint of the voltage resistance of the barrier layer.

In addition, the voltage dropping rate when the electrolytic potential is dropped continuously or stepwise is preferably 1 V/sec or less, more preferably 0.5 V/sec or less, and still more preferably 0.2 V/sec or less from the viewpoint of productivity.

<Etching Removal Treatment>

The etching removal treatment is not particularly limited and may be a chemical etching treatment for dissolution using an aqueous acid solution or an aqueous alkaline solution or may be a dry etching treatment.

(Chemical Etching Treatment)

The barrier layer by the chemical etching treatment may be removed by, for example, a method of immersing the structure after the anodizing treatment step in an aqueous acid solution or an aqueous alkaline solution, filling the micropores with the aqueous acid solution or the aqueous alkaline solution, and then bringing the surface of the anodized film on the opening side of the micropores into contact with a pH buffer solution or the like and only the barrier layer can be selectively dissolved.

Here, in the case of carrying out the treatment using an aqueous acid solution, it is preferable to use an aqueous solution of an inorganic acid such as sulfuric acid, phosphoric acid, nitric acid or hydrochloric acid, or a mixture thereof. The aqueous acid solution preferably has a concentration of 1% to 10% by mass. The temperature of the aqueous acid solution is preferably 15° C. to 80° C., more preferably 20° C. to 60° C., and still more preferably 30° C. to 50° C.

On the other hand, in the case of carrying out the treatment using an aqueous alkaline solution, it is preferable to use an aqueous solution of at least one alkali selected from the group consisting of sodium hydroxide, potassium hydroxide and lithium hydroxide. In addition, the aqueous alkaline solution preferably has a concentration of 0.1% to 5% by mass. The temperature of the aqueous alkaline solution is preferably 10° C. to 60° C., more preferably 15° C. to 45° C., and still more preferably 20° C. to 35° C.

Specifically, for example, a 40° C. aqueous solution containing 50 g/L of phosphoric acid, a 30° C. aqueous solution containing 0.5 g/L of sodium hydroxide, a 30° C. aqueous solution containing 0.5 g/L of potassium hydroxide, or the like is suitably used.

As the pH buffer solution, a buffer solution suitable to the aqueous acid solution or aqueous alkaline solution can be suitable used.

In addition, the time of immersion in the aqueous acid solution or aqueous alkaline solution is preferably 8 to 120 minutes, more preferably 10 to 90 minutes, and still more preferably 15 to 60 minutes.

(Dry Etching Treatment)

In the dry etching treatment, it is preferable to use, for example, a gas such as a $Cl_2$/Ar mixed gas.

<Metal Filling Step>

The metal filling step is a step of filling the micropores in the anodized film, which has been subjected to an electrolytic plating treatment, with a metal after the barrier layer removal step, and examples thereof include the same methods as each method described in paragraphs [0123] to [0126] and [FIG. 4] of JP2008-270158A. This corresponds to USPUB 2008/0284042.

[Trimming Step]

The trimming step is a step of removing only a part of the insulating base on the surface of the anisotropic conductive member after the conductive path forming step and causing the conductive paths to protrude.

Here, the trimming treatment is not particularly limited as long as the metal constituting the conductive paths is not dissolved, and for example, in the case of carrying out the treatment using an aqueous acid solution, it is preferable to use an aqueous solution of an inorganic acid such as sulfuric acid, phosphoric acid, nitric acid or hydrochloric acid, or a mixture thereof. Among these, it is preferable to use an aqueous solution not containing chromic acid from the viewpoint of excellent safety. The aqueous acid solution preferably has a concentration of 1% to 10% by mass. The temperature of the aqueous acid solution is preferably 25° C. to 60° C.

On the other hand, in the case of carrying out the treatment using an aqueous alkaline solution, it is preferable to use an aqueous solution of at least one alkali selected from the group consisting of sodium hydroxide, potassium hydroxide and lithium hydroxide. The aqueous alkaline solution preferably has a concentration of 0.1% to 5% by mass. The temperature of the aqueous alkaline solution is preferably 20° C. to 50° C.

Specifically, for example, a 40° C. aqueous solution containing 50 g/L of phosphoric acid, a 30° C. aqueous solution containing 0.5 g/L of sodium hydroxide, or a 30° C. aqueous solution containing 0.5 g/L of potassium hydroxide is suitably used.

The time of immersion in the aqueous acid solution or aqueous alkaline solution is preferably 8 to 120 minutes, more preferably 10 to 90 minutes, and still more preferably 15 to 60 minutes. Here, in the case of repeating an immersion treatment for a short period of time (trimming treatment), the time of immersion is a total of each time of immersion. Incidentally, a washing treatment may be carried out between each immersion treatment.

[Pressure Sensitive Adhesive Layer Forming Step]

The pressure sensitive adhesive layer forming step is a step of forming a pressure sensitive adhesive layer only on the surface of the insulating base after the trimming step.

Here, as the method of forming the pressure sensitive adhesive layer, for example, a method of applying a resin composition containing a polymer material having the above-described thermal expansion coefficient and a solvent (for example, methyl ethyl ketone or the like) to the surface of the insulating base and drying the resin composition, and baking the resin composition if required may be used.

The method of applying the resin composition is not particularly limited and for example, known coating methods such as a gravure coating method, a reverse coating method, a die coating method, and coating using a blade coater, a roll coater, an air knife coater, a screen coater, a bar coater, and a curtain coater can be used.

In addition, the drying method after coating is not particularly limited and for example, a treatment of carrying out heating at a temperature of 30° C. to 80° C. for several seconds to several tens of minutes and a treatment of carrying out heating at a temperature of 50° C. to 200° C. under a reduced pressure may be carried out.

The baking method after drying is not particularly limited because the baking method differs depending on a polymer material to be used. In the case of using a polyimide resin, for example, a treatment of carrying out heating at a temperature of 160° C. to 240° C. for 2 minutes to 1 hour or the like may be used. In the case of using an epoxy resin, for example, a treatment of carrying out heating at a temperature of 30° C. to 80° C. for 2 to 60 minutes or the like may be used.

[Wiring Substrate]

The wiring substrate used for the multilayer wiring substrate of the present invention is not particularly limited and may be a wiring substrate having a substrate, an electronic component which is formed on the substrate, such as a semiconductor element, a resistor, or a condenser, and a wiring which electrically connects between these electronic components, and the wiring substrate may have an electrode to be electrically connected to another wiring substrate through the anisotropic conductive member.

The wiring substrate may have configuration in which the electronic component and the wiring are formed on one surface of the substrate and the electrode is formed on the other surface, or may have a configuration in which the electronic component or the wiring is formed on the same surface with the electrode and the surface other than the electrode is insulated.

In addition, the outermost surface of the wiring substrate on which the anisotropic conductive member is laminated preferably has a surface roughness Ra of 5 nm or more. When the surface roughness Ra is less than 5 nm, the adhesion with the anisotropic conductive member (the bonding strength between the electrode and the conductive paths) can be further increased. However, the number of steps increases to reduce the surface roughness, thereby causing an increase in costs.

In contrast, as in the present invention, by adopting the configuration in which the conductive paths which come into contact with the electrode are deformed and adjacent conductive paths come into contact with each other, even when the surface roughness Ra is 5 nm or more, the bonding of the electrode and the conductive paths can be more reliably achieved.

[Substrate]

The substrate constituting the wiring substrate is not particularly limited and conventionally known various substrates such as a silicon substrate, a glass base, a ceramic base (for example, silicon carbide, and silicon nitride), a carbon base (for example, diamond-like carbon), a polyimide base, and a composite material of these can be used.

In addition, the thickness of the substrate is not particularly limited, but from the viewpoint of handleability and a reduction in distortion of the substrate, the thickness is preferably 1 μm to 1,000 μm.

[Electrode]

The electrode to be formed on the substrate is a portion to be electrically connected to the conductive paths of the anisotropic conductive member.

The material for the electrode is not particularly limited, and conventionally known various materials that can be used for an electrode in the wiring substrate can be used. As the material for the electrode, preferably, a material having an electrical resistivity of $10^3$ Ω·cm or less can be used. Specific suitable examples thereof include gold (Au), silver (Ag), copper (Cu), aluminum (Al), magnesium (Mg), nickel (Ni), and tin oxide doped with indium (ITO).

Among these, from the viewpoint of electrical conductivity, a metal is preferable, copper, gold, aluminum, and nickel are more preferable, copper and gold are still more preferable, and copper is particularly preferable from the viewpoint of costs and versatility.

In addition, when the conductive paths of the anisotropic conductive member are connected to the electrode, the electrode is more firmly bonded with the conductive paths and from the viewpoint of further enhancing conduction reliability, it is preferable to use the same material as the conductive paths of the anisotropic conductive member.

The arrangement, size, and shape of the electrode are not particularly limited as long as the conductive paths of the anisotropic conductive member can be reliably connected to the electrode. From the viewpoint of more reliably achieving the connection with the conductive paths, the surface area of the surface of the electrode with which the conductive paths come into contact is preferably 0.000025 mm$^2$ to 0.01 mm$^2$.

As shown in FIG. 2A, the surface of the electrode with which the conductive paths comes into contact is formed into a recessed shape by dicing. However, the shape of the surface of the electrode is not limited thereto and may be substantially flat or a convex shape.

[Passivation Layer]

The wiring substrate has a passivation layer on the surface of the substrate as a preferable embodiment.

The passivation layer is provided to prevent oxidation of the substrate, impart insulating properties, prevent permeation of impurities, and the like and is provided so as to cover the surface of the substrate other than a region in which the electrode is formed.

The material for constituting the passivation layer is not particularly limited and conventionally known various materials used for a wiring substrate can be used. Specifically, silicon nitride, silicon oxide, and polyimide can be used.

Although the thickness of the passivation layer is not particularly limited, from the viewpoint of more suitably exhibiting actions such as oxidation prevention, insulating property impartment, and the like, the thickness is preferably 1 μm to 50 μm.

[Resin Layer]

The wiring substrate may have a resin layer on the surface of the substrate or on the surface of the passivation layer as a preferable embodiment.

The resin layer is a portion into which the protrusions of the conductive paths of the anisotropic conductive member when the wiring substrate is laminated on the anisotropic conductive member are inserted and is thus provided to prevent the conductive paths other than the conductive paths which come into contact with the electrode from being deformed to be in contact with other conductive paths so as to attain electrical connection.

In addition, the resin layer may have functions of preventing oxidation of the substrate, imparting insulating properties, and the like, similar to the passivation layer.

The material for constituting the resin layer is not particularly limited and various resin materials can be used. Preferably, when the wiring substrate and the anisotropic conductive member are laminated, the resin layer has a degree of hardness at which the protrusions of the conductive paths are easily inserted into the resin layer.

As such materials for the resin layer, specifically, an epoxy-based material, an imide-based material, and the like can be used.

Although the thickness of the resin layer is not particularly limited, the resin layer preferably has a thickness capable of preventing contact of the inserted protrusions of the conductive paths with the substrate or the passivation layer. From this point, the thickness of the resin layer is preferably 0.5 μm to 500 μm and more preferably 1 μm to 250 μm.

Here, as described above, in the case of providing the resin layer, it is preferable that the surface of the resin layer is formed to be flush with the electrode.

[Method of Producing Multilayer Wiring Substrate]

Hereinafter, the method of producing the multilayer wiring substrate of the present invention will be described in detail.

The multilayer wiring substrate of the present invention is formed by alternately laminating and compressing the above-described anisotropic conductive member and wiring substrate.

Here, in the present invention, by appropriately setting the pressure, heating temperature, and the like when the anisotropic conductive member and the wiring substrate are compressed, the protrusions of the conductive paths which come into contact with the electrode are deformed so that adjacent conductive paths can be formed to come into contact with each other.

[Compression Treatment]

The conditions of the pressure, heating temperature, and the like when the anisotropic conductive member and the wiring substrate are compressed may be set to be appropriate according to the anisotropic conductive member and the wiring substrate to be bonded. From the viewpoint of a configuration in which while adjacent conductive paths are made come into contact with each other by deforming the conductive paths which come into contact with the electrode, the conductive paths which do not come into contact with the electrode do not come into contact with other conductive paths, the pressure during pressurization is preferably 0.2 MPa to 20 MPa, more preferably 0.2 MPa to 10 MPa, and still more preferably 0.5 MPa to 5 MPa. In addition, the heating temperature is preferably 150° C. to 350° C., more preferably 150° C. to 300° C., and still more preferably 150° C. to 250° C.

When the pressure during pressurization is set to 0.2 MPa or more, the electrode and the conductive paths can be sufficiently bonded. In addition, when the pressure during pressurization is set to 20 MPa or less, it is possible to suitably prevent damage of the anisotropic conductive member and the wiring substrate.

When the heating temperature is set to 150° C. or higher, the electrode and the conductive paths can be sufficiently bonded. In addition, when the heating temperature is set to 350° C. or lower, it is possible to suitably prevent fusion of the conductive paths other than the conductive paths which come into contact with the electrode.

It is preferable that the oxygen concentration of the atmosphere at the time of compression is low and the anisotropic conductive member and wiring substrate are preferably connected under a condition of 10 ppm or less.

In the present invention, when the above-described anisotropic conductive member and wiring substrate are connected to each other, if required, a removal treatment of removing an oxide film that can be formed at the ends (end surfaces) of the protrusions of the conductive paths in the anisotropic conductive member, or the like, and an activation treatment of activating the ends (end surfaces) of the protrusions of the conductive paths in the anisotropic conductive member or the surface of the pressure sensitive adhesive layer can be carried out.

[Removal Treatment]

For the method of removing the oxide film, for example, chemical treatments such as a formic acid treatment of removing an oxide film utilizing the reducing action of a formic acid gas, and a dissolving treatment of immersing an oxide film in an acidic liquid such as sulfuric acid to dissolve the oxide layer of the surface may be used.

In addition, a method of physically removing an oxide film by carrying out a treatment such as an ion beam treatment of irradiating the surface of an oxide film with an ion beam or a neutral atom beam in a high vacuum, and a plasma treatment of sealing a substrate in a plasma atmosphere and then applying a bias may also be used. An inert argon element or the like is used as an ion source or a plasma source.

[Activation Treatment]

For the activation treatment, a method of exposing an active surface by removing the oxide film, or the like using, physical energy as in the above-described physical oxide film removal treatment, or changing the bonding state of the surface of the pressure sensitive adhesive layer may be used.

In the case in which each of the above-described treatments is incorporated in a connection apparatus for preparing a multilayer wiring substrate, each of the treatments can be continuously carried out in a chamber.

In addition, in the case in which each of the treatments is not incorporated in the connection apparatus, the treatments are carried out outside a chamber and then the treated anisotropic conductive member and wiring substrate are quickly connected. Then, the same effect can be obtained.

For the connection apparatus, apparatuses based on various principles are put into practical use and the apparatuses are roughly divided into a permanent bonding apparatus for permanently bonding, silicon wafers and a temporary bonding apparatus for temporarily bonding silicon wafers. Any apparatus may be used as long as pressurizing capability, heating temperature, and connection environments are satisfied.

As representative connection apparatuses, for example, there are connection apparatuses launched from Mitsubishi Heavy Industries, Ltd., Ayumi Industrial Co., Ltd., Musashino Kogyo Co., Ltd., SUSS-MicroTec Inc., Bondtech Co., Ltd., Tokyo Electron Limited, Toray Engineering Co., Ltd., EVGroup Co., Ltd. PMT tea companies, and the like.

In the present invention, the connection of the anisotropic conductive member and the wiring substrate can be carried out under the conditions of, for example, a pressure during pressurization of 1 MPa or more, a heating temperature of 200° C. or higher, and an oxygen concentration of 10 ppm or less in a chamber.

The multilayer wiring substrate of the present invention can be suitably used as an interposer of a semiconductor package.

EXAMPLES

Hereinafter, the present invention will be described specifically with reference to the following examples. However, the present invention is not limited thereto.

First, the preparation of the anisotropic conductive member and the wiring substrate used in each example will be described.

[Preparation of Anisotropic Conductive Member]

(1) Preparation of Aluminum Substrate

Molten metal was prepared using an aluminum alloy containing Si: 0.06% by mass, Fe: 0.30% by mass, Cu: 0.005% by mass, Mn: 0.001% by mass, Mg: 0.001% by mass, Zn: 0.001% by mass, and Ti: 0.03% by mass, and a balance consisting of Al and unavoidable impurities and a molten metal treatment and filtration were carried out. Then, an ingot having a thickness of 500 mm and a width of 1,200 mm was prepared by a direct chilling casting (DC) method.

Next, the surface of the resulted ingot was cut by a facing machine so as to have an average thickness of 10 mm and then heated at 550° C. for about 5 hours to carry out a soaking treatment. When the temperature decreased to 400° C., the ingot was formed into a rolled plate having a thickness of 2.7 mm by using a hot roller.

Further, the heating treatment was conducted at 500° C. using a continuous annealing machine and then the annealed plate were cold-rolled to finish the plate to have a thickness of 1.0 mm, thereby obtaining a JIS 1050 aluminum substrate.

The aluminum substrate was cut into a width of 1,030 mm and then subjected to the respective treatments described below.

(2) Electropolishing Treatment

The aluminum substrate is subjected to an electropolishing treatment using an electropolishing solution having the following composition under the conditions of a voltage of 25 V, a solution temperature of 65° C., and a solution flow rate of 3.0 m/min.

A carbon electrode was used as a cathode and GP0110-30R (manufactured by TAKASAGO LTD.) was used as a power supply. The flow velocity of the electrolytic solution was measured using a VORTEX FLOW MONITOR FLM 22-10 PCW (manufactured by AS ONE Corporation).

(Composition of Electropolishing Solution)

85 mass % phosphoric acid (manufactured by Wako Pure Chemical Industries, Ltd.): 660 mL Pure water: 160 mL Sulfuric acid: 150 mL Ethylene glycol: 30 mL (3) Anodizing Treatment Step Subsequently, an anodizing treatment using a self-ordering method was carried out on the aluminum substrate subjected to the electropolishing treatment according to the procedure described in JP2007-204802A.

The aluminum substrate subjected to the electropolishing treatment was subjected to 5 hours of a preliminary anodizing treatment with an electrolytic solution of 0.50 mol/L oxalic acid under the following conditions: voltage: 40 V; solution temperature: 16° C.; and solution flow velocity: 3.0 m/min.

After preliminary anodization, the aluminum substrate was subjected to a film removal treatment in which the substrate was immersed for 12 hours in a mixed aqueous solution (solution temperature: 50° C.) of 0.2 mol/L chromic anhydride and 0.6 mol/L phosphoric acid.

Then, the aluminum substrate was subjected to 10 hours of a re-anodizing treatment with an electrolytic solution of 0.50 mol/L oxalic acid under the following conditions: voltage, 40 V; solution temperature, 16° C.; and solution flow velocity, 3.0 m/min. An anodized film having a thickness of 80 µm was thus obtained.

The preliminary anodizing treatment and the re-anodizing treatment were both carried out using a stainless steel electrode as the cathode and using a GP0110-30R (manufactured by Takasago Ltd.) as the power supply. NEO-COOL BD36 (Yamato Scientific Co., Ltd.) was used as the cooling system, and PAIRSTIRRER PS-100 (manufactured by Tokyo Rikakikai Co., Ltd.) was used as the stirring and warming unit. In addition, the flow velocity of the electrolytic solution was measured using the vortex flow monitor FLM22-10PCW (manufactured by As One Corporation).

(4) Barrier Layer Removal Step

Next, using the same treatment liquid as in the anodizing treatment under the same conditions as in the anodic oxidation treatment, an electrolytic treatment (electrolytic removal treatment) was carried out while continuously decreasing the voltage from 40 V to 0 V at a voltage decrease rate of 0.2 V/sec.

Then, an etching treatment (etching removal treatment) of immersing the anodized film in 5 mass % phosphoric acid at 30° C. for 30 minutes was carried out. As a result, a barrier layer present in the bottom of the micropores of the anodized film was removed, and aluminum was exposed through the micropores.

Here, the average opening diameter of the micropores present in the anodized film having undergone the barrier layer removal step was 60 nm. The average opening diameter was calculated as the average value of opening diameters measured at 50 positions after capturing a surface image (magnification: 50,000 times) with a field emission—scanning electron microscope (FE-SEM).

In addition, the average thickness of the anodized film having undergone the barrier layer removal step was 80 µm. The average thickness was calculated as the average value of thicknesses measured at 10 positions after cutting the anodized film with focused ion beam (FIB) in a thickness direction and capturing a surface image (magnification: 50,000 times) of the cross-section with FE-SEM.

In addition, the density of the micropores present in the anodized film was about 100,000,000 pores/mm$^2$. The density of the micropores was measured and calculated using the method described in paragraphs [0168] and [0169] of JP2008-270158A.

In addition, the degree of regularity of the micropores present in the anodized film was 92%. The degree of regularity was measured and calculated using the method described in Paragraphs [0024] to [0027] of JP2008-270158A (corresponding to US PUB 2008/0284042) after capturing a surface image (magnification: 20,000 times) with FE-SEM.

(5) Metal Filling Step (Electrolytic Plating Treatment)

Next, an electrolytic plating treatment was carried out by using the aluminum substrate as a cathode and using platinum as a positive electrode.

Specifically, constant current electrolysis was carried out using a copper plating solution having the following composition. As a result, a metal-filled microstructure was prepared in which the micropores were filled with copper.

Here, the constant-current electrolysis was carried out using a plating apparatus (manufactured by Yamamoto-MS Co., Ltd.) and a power supply (HZ-3000, manufactured by Hokuto Denko Corp.) under the following conditions after carrying out cyclic voltammetry in the plating solution to check the deposition potential.

(Composition of Copper Plating Solution and Conditions)

Copper sulfate: 100 g/L

Sulfuric acid: 50 g/L

Hydrochloric acid: 15 g/L

Temperature: 25° C.

Current density: 10 A/dm$^2$

The surface of the anodized film in which the micropores were filled with the metal was observed with FE-SEM, and whether or not 1,000 micropores were sealed with the metal was determined to calculate a pore sealing ratio (the number of sealed micropores/1,000 pores). At this time, the pore sealing ratio was 96%.

In addition, the anodized film in which the micropores were filled with the metal was cut using FIB in a thickness direction, a surface image (magnification: 50,000 times) of a cross-section was obtained with FE-SEM, and the inside of the micropores was observed. At this time, it was found that the sealed micropores were completely filled with the metal.

(6) Substrate Removal Step

Next, the aluminum substrate was removed by dissolution by being dipped in 20 mass % mercury chloride aqueous solution (corrosive sublimate) at 20° C. for 3 hours. Thus, a metal-filled microstructure was prepared.

(7) Trimming Step

Next, the metal-filled microstructure was immersed in an aqueous sodium hydroxide solution (concentration: 5 mass %, liquid temperature: 20° C.) and the time of immersion was changed to have a height of 500 nm of the protrusion. The surface of the anodized film of aluminum was selectively dissolved to cause the copper columns which are conductive paths to protrude, thereby preparing a structure.

Next, the prepared structure was washed with water and dried, and then was observed with FE-SEM. The height of the protrusions of the conductive paths, the diameter of the protrusions of the conductive paths, and the aspect ratio (height of protrusion/diameter of protrusion) were measured. The aspect ratio was 8.

(8) Pressure Sensitive Adhesive Layer Forming Step

A pressure sensitive adhesive layer was formed on the structure subjected to the trimming step by the following manner. Thus, an anisotropic conductive member was prepared.

A solution obtained by dissolving the following components in methyl ethyl ketone at the following formulation was applied to the surface and dried, and further baked at 130° C. for 2 minutes to form a pressure sensitive adhesive layer.

The thickness of the pressure sensitive adhesive layer was adjusted to be flush with the protrusion by adding a solvent (MEK: methyl ethyl ketone). In addition, drying after the application was carried out by setting a temperature to 50° C. under reduced pressure of a pressure reduction degree of −400 mmH$_2$O to avoid surface solidification of the pressure sensitive adhesive layer.

<Coating Solution Composition>

Elastomer: acrylic acid ester-based polymer having butyl acrylate acrylonitrile as a main component (trade name: SG-28GM, manufactured by Nagase ChemteX Corporation) 5 parts by mass Epoxy resin 1: jER (registered trademark) 828 (manufactured by Mitsubishi Chemical Corporation) 33 parts by mass Epoxy resin 2: jER (registered trademark) 1004 (manufactured by Mitsubishi Chemicals Corporation) 11 parts by mass Phenolic resin: MILEX XLC-4L (manufactured by Mitsui Chemicals, Inc.) 44 parts by mass Organic acid: o-anisic acid (ortho anisic acid, manufactured by Tokyo Chemical Industry Co., Ltd.) 0.5 parts by mass Curing Agent: imidazole catalyst (2PHZ-PW, manufactured by Shikoku Chemicals Corporation) 0.5 parts by mass

[Preparation of Wiring Substrate (TEG Chip)]

A test element group (TEG) chip (daisy chain pattern) having two Cu pads (electrodes) was prepared as a wiring substrate as follows.

First, a wafer on which a redistribution layer (RDL) was formed was used as a support, and a silicon nitride (SiN) film having a thickness of 100 nm was formed on the surface as a passivation layer.

Next, a photosensitive polyimide layer was formed on the passivation layer. As the material for the photosensitive polyimide layer, SP-453 manufactured by Toray Industries, Inc. was used. The coating solution was applied to the surface and dried, and then further baked at 130° C. for 2 minutes to form a photosensitive polyimide layer. Further, a pattern in which the electrode portion for connection is opened is formed on the photosensitive polyimide layer by an exposure development treatment.

Next, dry etching was carried out and the SiN film of the opening of the photosensitive polyimide layer was removed.

After the SiN film of the opening was removed, a damascene treatment was carried out to fill the opening with copper. Further, a chemical mechanical polishing (CMP) treatment was carried out and the filled copper and the photosensitive polyimide layer were cut to be flush with each other to adjust the thickness. Thus, a Cu pad (electrode) for connection was formed.

The TEG chip having the structure of the electrode for connection in a state in which the CMP treatment was carried out was used as a TEG chip (A) having a resin layer on a passivation layer. That is, the photosensitive polyimide layer is a resin layer.

Further, after the CMP treatment, the photosensitive polyimide layer was removed by etching. The TEG chip having the electrode structure for connection in this state was used as a TEG chip (B) having a step between a passivation layer and a Cu pad surface.

By adjusting the polishing thickness at the time of the CMP treatment, the step between the Cu pad surface and the passivation layer was adjusted.

Further, after the photosensitive polyimide layer was removed, a CMP treatment was carried out again and a step between the passivation layer and the Cu pad was removed. The TEG chip having the structure of the electrode for connection was used as a TEG chip (C) not having a step between a passivation layer and a Cu pad surface.

[Preparation of Multilayer Wiring Substrate]

The anisotropic conductive member and the TEG chip (wiring substrate) prepared as described above were used and the multilayer wiring substrate of each example was prepared.

Examples 1 to 7

For Examples 1 to 7, multilayer wiring substrates having the configuration shown in FIG. 2B were repapered.

The TEG chip (B) having a step between the passivation layer and the Cu pad surface was used as a wiring substrate. The step between the passivation layer and the Cu pad surface was 50 nm.

The TEG chop (B) and the anisotropic conductive member were laminated in this order and bonded using a room temperature bonding apparatus (WP-100, manufactured by PMT Corporation) under the conditions shown in Table 1 and the condition of retaining for 5 minutes to prepare a sample of a multilayer wiring substrate.

When the bonding portion of each prepared multilayer wiring substrate was cut with FIB in a thickness direction and the cross section thereof was observed by capturing a surface image (magnification: 50,000 times) of the cross-section with FE-SEM, adjacent conductive paths of the conductive paths coming into contact with the electrode came into contact with each other and the conductive paths not coming into contact with the electrode did not come into contact with other conductive paths in all of Examples 1 to 7. As an example, FIG. 4 shows a cross sectional photograph of Example 1.

Example 8

For Example 8, a multilayer wiring substrate having a configuration shown in FIG. 2B was prepared.

That is, the multilayer wiring substrate was prepared in the same manner as in Example 5 except that the step between the passivation layer and the Cu pad surface of the TEG chip (B) was set to 150 nm.

When the bonding portion of the prepared multilayer wiring substrate was cut with FIB in a thickness direction and the cross section thereof was observed by capturing a surface image (magnification: 50,000 times) of the cross-section with FE-SEM, adjacent conductive paths of the conductive paths coming into contact with the electrode came into contact with each other and the conductive paths not coming into contact with the electrode were embedded in the pressure sensitive adhesive layer not to come into contact with other conductive paths.

Example 9

For Example 9, a multilayer wiring substrate having a configuration shown in FIG. 2A was prepared.

That is, the multilayer wiring substrate was prepared as in Example 5 except that using the TEG chip (A) having the resin layer on the passivation layer as a wiring substrate, the thickness of the resin layer was set to 400 nm.

When the bonding portion of the prepared multilayer wiring substrate was cut with FIB in a thickness direction and the cross section thereof was observed by capturing a surface image (magnification: 50,000 times) of the cross-section with FE-SEM, adjacent conductive paths of the conductive paths coming into contact with the electrode came into contact with each other and the conductive paths not coming into contact with the electrode were inserted into the resin layer not to come into contact with other conductive paths.

Examples 10 and 11

For Examples 10 and 11, multilayer wiring substrates having a configuration shown in FIG. 2C were prepared.

That is, multilayer wiring substrates were prepared in the same manner as in Example 1 except that the TEG chip (C) not having a step between the passivation layer and the Cu pad surface was used as a wiring substrate and multilayer wiring substrates were respectively prepared under the bonding conditions shown in Table 1.

When the bonding portion of each prepared multilayer wiring substrate was cut with FIB in a thickness direction and the cross section thereof was observed by capturing a surface image (magnification: 50,000 times) of the cross-section with FE-SEM, adjacent conductive paths of the conductive paths coming into contact with the electrode came into contact with each other and the conductive paths which did not come into contact with the electrode not coming into contact with other conductive paths in Examples 10 and 11.

Comparative Examples 1 to 5

Samples of multilayer wiring substrates were prepared in the same manner as in Example 1 except that the conditions when the TEG chip, the anisotropic conductive member, and the Cu film were bonded were changed to the conditions shown in Table 1.

When the bonding portion of each prepared multilayer wiring substrate was cut with FIB in a thickness direction and the cross section thereof was observed by capturing a surface image (magnification: 50,000 times) of the cross-section with FE-SEM, adjacent conductive paths of the conductive paths coming into contact with the electrode did not come into contact with each other in Comparative Examples 1 and 4 and the conductive paths not coming into contact with the electrode came into contact with other conductive paths in Comparative Example 5.

Comparative Example 6

A sample of a multilayer wiring substrate was prepared in the same manner as in Examples 3 except that the anisotropic conductive member did not have a pressure sensitive adhesive layer.

When the bonding portion of the prepared multilayer wiring substrate was cut with FIB in a thickness direction and the cross section thereof was observed by capturing a surface image (magnification: 50,000 times) of the cross-section with FE-SEM, adjacent conductive paths of the conductive paths coming into contact with the electrode did not come into contact with each other.

[Evaluation]

The conductivity, adhesiveness, and in-plane insulating properties of the prepared sample of the multilayer wiring substrate were evaluated.

<Conductivity>

A Cu film was bonded to the surface of anisotropic conductive member of the sample opposite to the TEG chip.

The Cu film was prepared by forming a film of Cu having a thickness of 200 nm on the wafer surface. A total thickness variation (TTV) which indicates the degree of flatness was 50 nm.

Then, a signal line for resistance measurement was soldered to the two Cu pads of the TEG chip of the sample and the soldered sample was dried at 125° C. for 24 hours and further subjected to a moisture absorbing treatment at 85° C. and 60% RH for 168 hours. Subsequently, a solder reflow treatment step (maximum temperature: 265° C.) was carried out three times.

The sample through the above history was supplied to a temperature cycle test under the condition of (−65° C./+150° C.).

The resistance value between the Cu pads was measured for each $100^{th}$ cycle until $1,000^{th}$ cycles. As a result, a case in which the rate of change of the resistance value (resistance value at $1,000^{th}$ cycle/resistance value at $100^{th}$ cycle) was less than 10% was evaluated as "A", a case in which the rate of change of the resistance value was 10% or more and less than 50% was evaluated as "B", a case in which the range of change of the resistance value was 50% or more was evaluated as "C", and a case in which conduction was not attained was evaluated as "D".

<Adhesiveness>

For the sample, a die shear test was carried out using a universal bonding tester (DAGE 4000, manufactured by Nordson Corporation), and adhesiveness between the anisotropic conductive member and the TEG chip was evaluated.

Based on the peeling strength of Example 2, a peeling strength of 110% or more was evaluated as "AA", a peeling strength of less than 110% and 90% or more was evaluated as "A", a peeling strength of less than 90% and 50% or more was evaluated as "B", a peeling strength of less than 50% and 10% or more was evaluated as "C", and a peeling strength of less than 10% was evaluated as "D".

<In-Plane Insulating Properties>

A signal line for resistance measurement was soldered to the conductive paths coming into contact with the Cu pad in the surface of the anisotropic conductive member of the sample opposite to the TEG chip and the conductive paths adjacent to the conductive paths and not coming into contact with the Cu pad and the soldered sample was supplied to a temperature cycle test under the condition of (−65° C./+150° C.).

The resistance value between the conductive paths was measured for each $100^{th}$ cycle until $1,000^{th}$ cycles. As a result, a case in which the rate of change of the resistance value (resistance value at $1,000^{th}$ cycle/resistance value at $100^{th}$ cycle) was less than 10% was evaluated as "A", a case in which the rate of change of the resistance value was 10% or more and less than 50% was evaluated as "B", and a case in which lateral insulation was not attained was evaluated as "C".

The evaluation results are shown in Table 1.

TABLE 1

| | Adhesion condition | | Conductive Path | | Evaluation | | |
|---|---|---|---|---|---|---|---|
| | Adhesion temperature (° C.) | Pressurization (MPa) | Electrode portion | Non-electrode portion | Conductivity | Adhesiveness | In-plane insulating properties |
| Example 1 | 350 | 0.5 | Mutual contact | Non-contact | A | A | B |
| Example 2 | 220 | 0.5 | Mutual contact | Non-contact | A | A | A |
| Example 3 | 200 | 0.5 | Mutual contact | Non-contact | B | A | A |
| Example 4 | 200 | 1 | Mutual contact | Non-contact | A | A | A |
| Example 5 | 180 | 1 | Mutual contact | Non-contact | B | B | A |
| Example 6 | 180 | 15 | Mutual contact | Non-contact | A | A | A |
| Example 7 | 160 | 15 | Mutual contact | Non-contact | B | B | A |
| Example 8 | 180 | 1 | Mutual contact | Non-contact | A | A | A |
| Example 9 | 180 | 1 | Mutual contact | Non-contact | A | AA | A |
| Example 10 | 220 | 1 | Mutual contact | Non-contact | A | A | A |
| Example 11 | 200 | 1 | Mutual contact | Non-contact | B | A | A |
| Comparative Example 1 | 180 | 0.15 | Non-contact | Non-contact | C | C | A |
| Comparative Example 2 | 160 | 0.15 | Non-contact | Non-contact | D | C | A |
| Comparative Example 3 | 140 | 1 | Non-contact | Non-contact | C | C | A |
| Comparative Example 4 | 140 | 15 | Non-contact | Non-contact | C | C | A |
| Comparative Example 5 | 400 | 0.15 | Mutual contact | Mutual contact | A | A | C |
| Comparative Example 6 | 200 | 0.15 | Non-contact | Non-contact | B | C | A |

From the results shown in Table 1, it is found that the multilayer wiring substrates of the present invention in which adjacent conductive paths of the conductive paths coming into contact with the electrode come into contact with each other and the conductive paths not coming into contact with the electrode do not come into contact with other conductive paths in Examples 1 to 11 have good adhesiveness, high conductivity, high in-plane insulating properties, and high conduction reliability.

In contrast, from Comparative Examples 1 to 4 and 6, it is found that in the case in which the conductive paths coming into contact with the electrode do not come into contact with each other, the adhesiveness is decreased and conductivity is deteriorated. In addition, from Comparative Example 5, it is found that when the conductive paths not coming into contact with the electrode come into contact with each other, the insulating properties are deteriorated.

Further, in comparison with Examples 4, 5, 8, 9, 10, and 11, it is found that the electrode of the wiring substrate is preferably formed to protrude from the passivation layer and further the wiring substrate preferably has a resin layer.

The effects of the present invention become apparent from the above results.

EXPLANATION OF REFERENCES

1: anisotropic conductive member
2: insulating base
3: conductive path
3a, 3b: protrusion of conductive path
4: pressure sensitive adhesive layer
6: thickness of insulating base
7: width between conductive paths
8: diameter of conductive path 9: center-to-center distance (pitch) between conductive paths
10: multilayer wiring substrate
11: wiring substrate
12: electrode
13: resin layer
14: passivation layer
20: wiring substrate

What is claimed is:

1. A multilayer wiring substrate comprising:
an anisotropic conductive member including an insulating base which is made of an inorganic material, a plurality of conductive paths which are made of a conductive member, penetrate the insulating base in a thickness direction thereof and are provided in a mutually insulated state, and a pressure sensitive adhesive layer which is provided on a surface of the insulating base, in which each conductive path has a protrusion protruding from the surface of the insulating base; and
a wiring substrate having a substrate and one or more electrodes to be formed on the substrate,
wherein the multilayer wiring substrate is formed by laminating the anisotropic conductive member and the wiring substrate,
the wiring substrate has a resin layer which covers at least a part of the substrate,
the electrode is formed to be flush with the resin layer,
the resin layer is a layer that allows the protrusion to penetrate therein when pressure is applied at 20 MPa,
at least a part of the protrusions of the conductive paths other than the conductive paths which come in contact with the electrode among the plurality of conductive paths penetrates into the resin layer, and
conductive paths which come into contact with the electrode among the plurality of conductive paths are deformed so that adjacent conductive paths come into contact with each other.

2. The multilayer wiring substrate according to claim 1, wherein the protrusions of the conductive paths other than the conductive paths which come in contact with the electrode among the plurality of conductive paths are embedded in the pressure sensitive adhesive layer.

3. The multilayer wiring substrate according to claim 2, wherein materials for the electrode and the conductive path are the same.

4. The multilayer wiring substrate according to claim 2, wherein the material for the conductive path is copper.

5. The multilayer wiring substrate according to claim 2, wherein the pressure sensitive adhesive layer does not contain a filler.

6. The multilayer wiring substrate according to claim 1, wherein materials for the electrode and the conductive path are the same.

7. The multilayer wiring substrate according to claim 6, wherein the material for the conductive path is copper.

8. The multilayer wiring substrate according to claim 7, wherein the pressure sensitive adhesive layer does not contain a filler.

9. The multilayer wiring substrate according to claim 6, wherein the pressure sensitive adhesive layer does not contain a filler.

10. The multilayer wiring substrate according to claim 1, wherein materials for the electrode and the conductive path are the same.

11. The multilayer wiring substrate according to claim 1, wherein the material for the conductive path is copper.

12. The multilayer wiring substrate according to claim 1, wherein the material for the conductive path is copper.

13. The multilayer wiring substrate according to claim 1, wherein the pressure sensitive adhesive layer does not contain a filler.

14. The multilayer wiring substrate according to claim 1, wherein the pressure sensitive adhesive layer does not contain a filler.

15. The multilayer wiring substrate according to claim 1, wherein conductive paths which come into contact with the electrode among the plurality of conductive paths are deformed so that adjacent conductive paths come into direct contact with each other.

* * * * *